US008964366B2

(12) United States Patent
Huang et al.

(10) Patent No.: US 8,964,366 B2
(45) Date of Patent: Feb. 24, 2015

(54) WATERPROOFING BACKING ADHESIVE STRUCTURE

(71) Applicant: Wistron Corporation, New Taipei (TW)

(72) Inventors: Hou-Chun Huang, New Taipei (TW); Chih-Feng Yeh, New Taipei (TW)

(73) Assignee: Wistron Corporation, New Taipei (TW)

( * ) Notice: Subject to any disclaimer, the term of this patent is extended or adjusted under 35 U.S.C. 154(b) by 213 days.

(21) Appl. No.: 13/670,286

(22) Filed: Nov. 6, 2012

(65) Prior Publication Data

US 2013/0214656 A1 Aug. 22, 2013

(30) Foreign Application Priority Data

Feb. 17, 2012 (TW) ............................. 101105303 A (51) Int. Cl.
*G06F 1/16* (2006.01)
*G02F 1/1333* (2006.01)

(52) U.S. Cl.
CPC ........ *G02F 1/133308* (2013.01); *G06F 1/1656* (2013.01)
USPC .......................... 361/679.21; 349/58; 277/644

(58) Field of Classification Search
CPC ..................... G02F 1/133308; G02F 1/1656
USPC ............ 361/679.01, 679.21; 277/644; 349/58
See application file for complete search history.

(56) References Cited

U.S. PATENT DOCUMENTS

| | | | |
|---|---|---|---|
| 7,182,500 B2 * | 2/2007 | Sugawara ...................... | 362/634 |
| 7,854,434 B2 * | 12/2010 | Heiman et al. ................ | 277/644 |
| 7,936,416 B2 * | 5/2011 | Huang et al. ................... | 349/58 |
| 7,975,870 B2 * | 7/2011 | Laule et al. .................... | 220/582 |
| 8,199,488 B2 * | 6/2012 | Zou et al. ................. | 361/679.55 |
| 2004/0004680 A1 * | 1/2004 | Kim ................................ | 349/58 |
| 2006/0290070 A1 * | 12/2006 | Park ............................... | 277/559 |
| 2007/0236465 A1 * | 10/2007 | Chou et al. .................... | 345/173 |
| 2007/0292650 A1 | 12/2007 | Suzuki | |
| 2010/0014232 A1 * | 1/2010 | Nishimura ................. | 361/679.3 |
| 2011/0051348 A1 * | 3/2011 | Song ........................ | 361/679.26 |

FOREIGN PATENT DOCUMENTS

| | | |
|---|---|---|
| TW | 412135 | 11/2000 |
| TW | I325660 | 6/2010 |
| TW | M394310 | 12/2010 |
| TW | I352229 | 11/2011 |
| TW | 201202379 A1 | 1/2012 |
| TW | 363804 | 5/2012 |

* cited by examiner

*Primary Examiner* — Adrian S Wilson (74) *Attorney, Agent, or Firm* — Muncy, Geissler, Olds & Lowe, P.C.

(57) ABSTRACT

A waterproofing backing adhesive structure is disclosed. The waterproofing backing adhesive structure is applied to an electronic device having a front cover and a display panel. The waterproofing backing adhesive structure includes an adhesive main body, an adhesive material, and a plurality of air chambers. The plurality of air chambers are formed on at least one of the surfaces of an upper surface or a bottom surface of the adhesive main body which is attached with the adhesive material for accommodating the air of a bubble generated when the adhesive main body is attached to the front cover or the display panel. The plurality of air chambers are for releasing the pressure of the bubble.

24 Claims, 6 Drawing Sheets

WATERPROOFING BACKING ADHESIVE STRUCTURE

BACKGROUND OF THE INVENTION

1. Field of the Invention

The present invention relates to a waterproofing backing adhesive structure, especially a waterproofing backing adhesion for being adhered between the front cover and the display panel that prevents detachment of the waterproofing backing adhesive structure from the front cover or the display panel due to a bubble.

2. Description of the Related Art

There are two major methods of waterproof design for current electronic products. One is by using the installation of an O-type gasket. Though the O-type gasket has the advantage of reuse, it needs a larger space for installation, so it is not suitable for application in small lightweight electronic products. The other is by using a waterproof backing adhesive. A waterproof backing adhesive can be applied in small lightweight electronic products and can provide a good waterproofing effect as well; however, the following problems will occur while it is in use.

Figure 1:
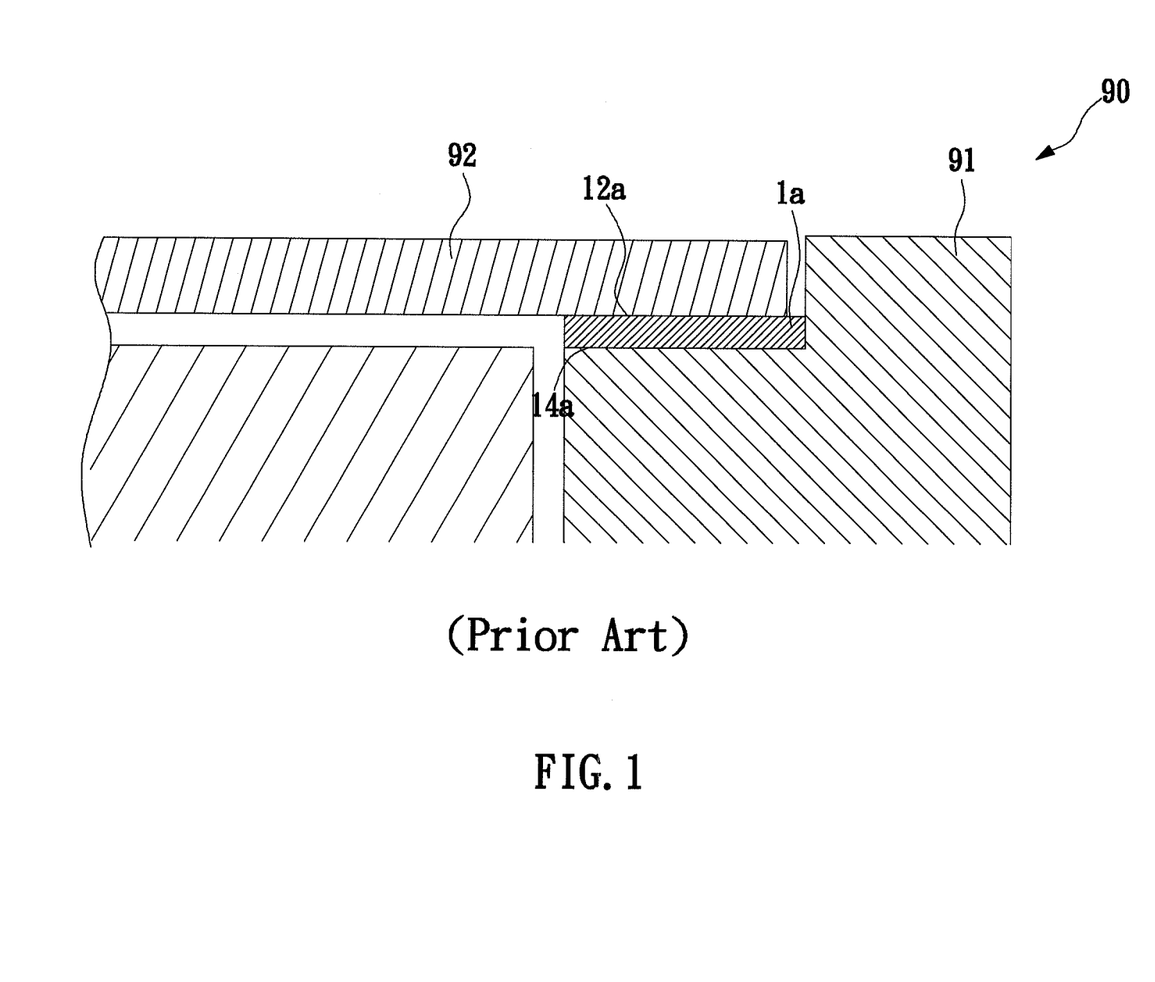
FIG. 1 is a lateral cutaway perspective drawing of the electronic device of the waterproofing backing adhesive structure that has been previously disclosed.
Figure 2:
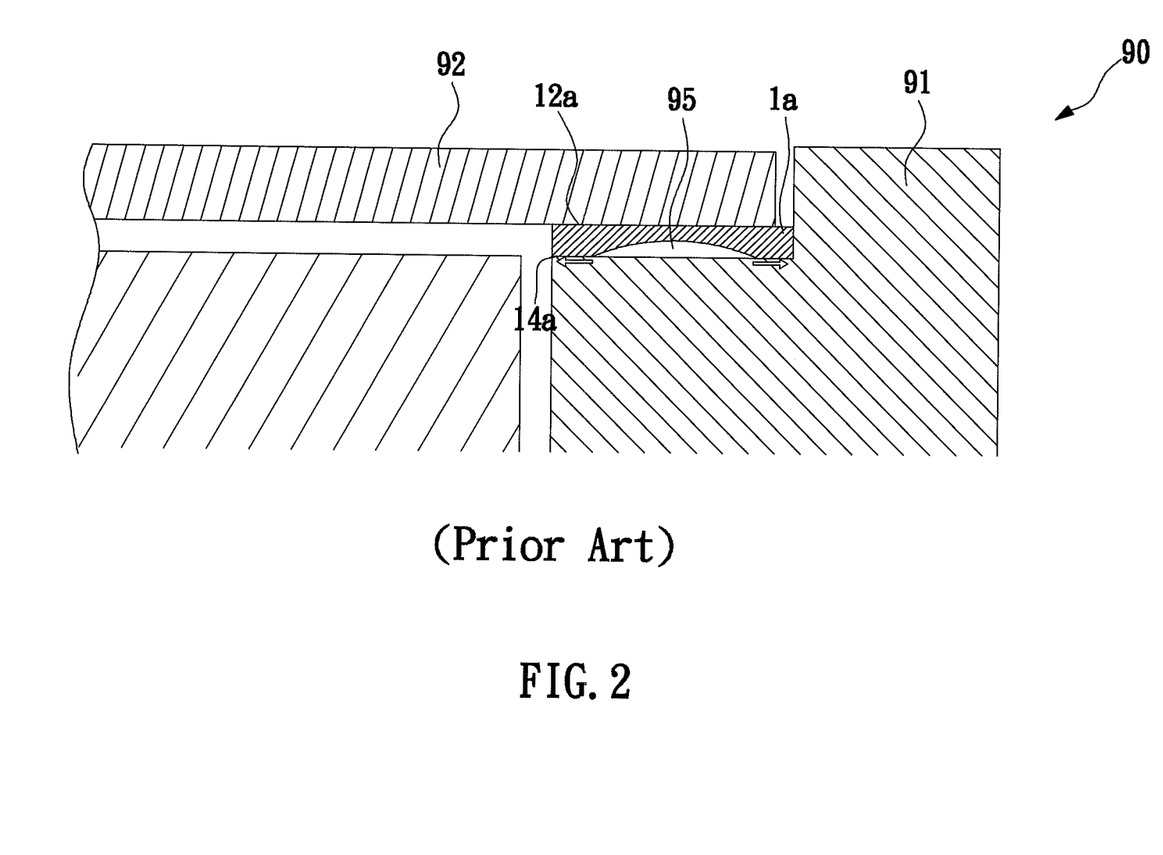
FIG. 2 shows an illustration of the formation of the bubble in the backing adhesive main body and the front cover in FIG. 1.

Please refer to FIG. 1, which is related to a waterproof backing adhesive structure whose technology has been previous disclosed. Usually in the assembly process of the electronic device 90, production workers will first remove the paper-film on the bottom surface 14a of the backing adhesive 1a, adhere it to the front cover 91 of the electronic device 90, and then remove the paper-film on the upper surface 12a, after which the workers press and glue the display panel 92 of the electronic device 90 to the upper surface 12a of the backing adhesive 1a to make it adhere to the backing adhesive 1a. However, in the process of adhering the backing adhesive 1a, and in the instance of adhering the backing adhesive 1a, if the process of adhesion is not smooth enough to fully expel all air from between the backing adhesive 1a and the front cover 91 or display panel 92, the unexpelled air will be captured between the backing adhesive 1a and the front cover 91 or display panel 92 and will form an bubble 95 (as shown in FIG. 2). Although the existence of the bubble 95 will not immediately affect the usage of the electronic device 90, the bubble 95 will gradually expand and contract under air pressure due to expansion when it is hot, shrinkage when it is cold, or other factors of the backing adhesive 1a, over a long period of use of the electronic device 90 (as shown with an arrow in the figure). Therefore, if the width of the backing adhesive 1a is not wide enough (especially for handheld devices such as mobile phones of small size—if the visible area of the display panel is to be expanded, the width of the backing adhesive needs to be shrunken), it could lead to a local opening between the backing adhesive 1a and the front cover 91 or display panel 92, form a channel for leakage, allow water vapor to easily seep into the leakage, and cause the failure of the backing adhesive, which does not meet the requirements and standards of waterproof and dustproof of the IP (Ingress Protection).

SUMMARY OF THE INVENTION

The main purpose of the present invention is to provide a waterproofing backing adhesion structure that prevents the formation of a gap between the backing adhesive main body and the display panel or the backing adhesive main body and the front cover due to the expansion of bubbles between the backing adhesive main body and the display panel or the backing adhesive main body and the front cover.

Another major purpose of the present invention is to provide an electronic device which comprises the aforementioned waterproofing backing adhesion structure.

In order to achieve the purpose mentioned above, the waterproofing backing adhesive structure of the present invention can be applied to an electronic device. The electronic device includes a front cover and a display panel. The waterproofing backing adhesive structure is to be adhered between the front cover and the display panel, and the waterproofing backing adhesive structure includes a backing adhesion main body, an adhesive material, and a plurality of air chambers. The backing adhesive main body includes an upper surface and a bottom surface; the adhesive material is to be adhered to at least one surface of the upper surface and the bottom surface of the backing adhesive main body to adhere the backing adhesive main body between the front cover and the display panel; the plurality of air chambers are formed on at least one surface of an upper surface or a bottom surface of the backing adhesive main body where there is adhesive material for accommodating air in a bubble generated when the backing adhesive main body is attached to the front cover or the display panel; the plurality of air chambers are for releasing the pressure of the bubble.

In one of the embodiments of the present invention, the backing adhesive main body of the present invention includes a plurality of ribs, which form air chambers, wherein the upper surface and the bottom surface of the backing adhesive main body comprise the plurality of ribs installed in a parallel fashion and extending parallel to the direction of the length of the backing adhesive, and the plurality of parallel ribs on the upper surface and the bottom surface of the backing adhesive main body correspond to each other, and the heights of the plurality of ribs on the same surface are essentially the same.

In one of the embodiments of the present invention, the plurality of ribs of the backing adhesive main body of the present invention are installed in an interwoven fashion on the upper surface and on the bottom surface of the backing adhesive main body; the interwoven plurality of ribs on the upper surface and the bottom surface of the backing adhesive main body correspond to each other.

In one of the embodiments of the present invention, the backing adhesive of the present invention includes a plurality of sockets, and the plurality of air chambers is formed inside the space of the plurality of sockets.

In one of the embodiments of the present invention, the waterproofing backing adhesive structure further comprises at least one paper-film, and the at least one paper-film is adhered on the adhesive material of the surface of the backing adhesive main body.

In one of the embodiments of the present invention, the plurality of air chambers are independent of each other and are not connected with each other.

In order to achieve another purpose of the present invention, the electronic device of the present invention includes a front cover, a display panel, and the afore-mentioned waterproofing backing adhesive structure, wherein the waterproofing backing adhesive structure is adhered between the front cover and the display panel.

DETAILED DESCRIPTION OF THE PREFERRED EMBODIMENTS

In order to make it easier to understand the purposes, features, and advantages of the present invention, hereinafter, specific embodiments of the present invention are presented below, with illustrations and descriptions in detail.

Figure 3:
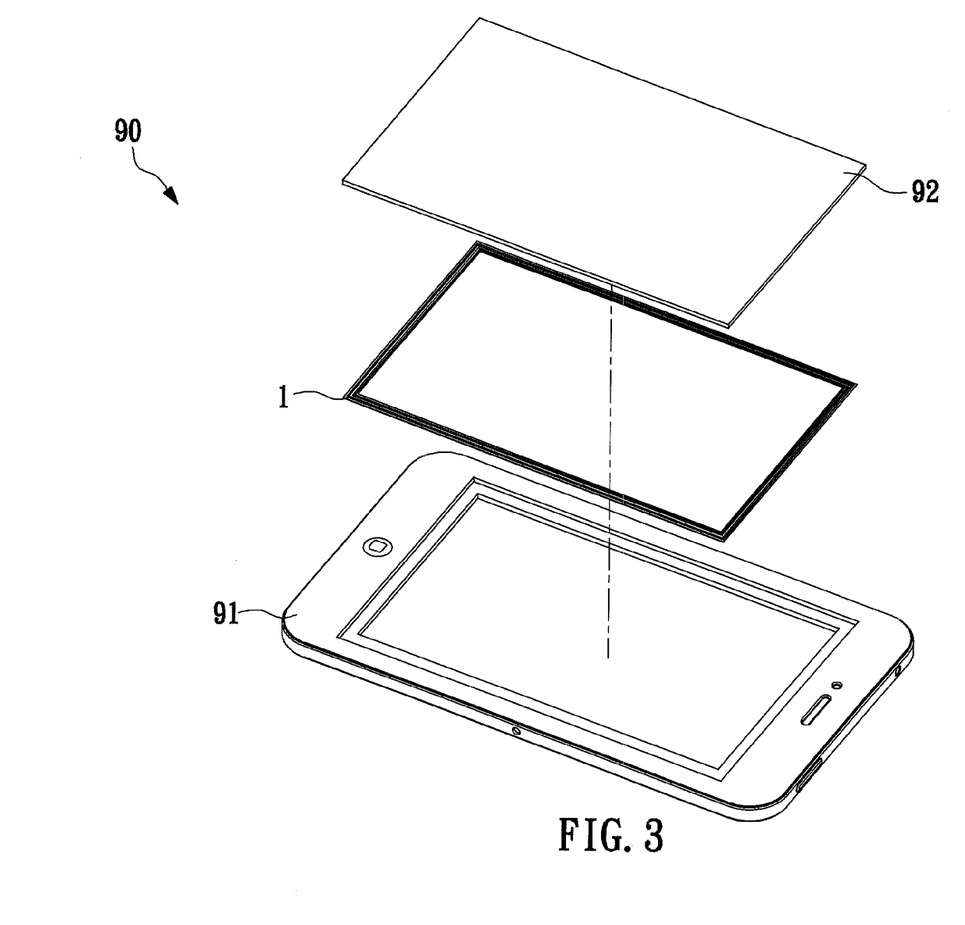
FIG. 3 is a break-down illustration of the electronic device of the present invention.

Please refer to FIG. 3, which is a break-down illustration of the electronic device of the present invention.

As shown in FIG. 3, in one of the embodiments of the present invention, the waterproofing backing adhesive structure 1 of the present invention is applied to an electronic device 90, especially a handheld electronic device 90 with an IP level of waterproof function. The electronic device 90 includes a front cover 91 and a display panel 92 (which can also be a touch screen display panel), and the waterproofing backing adhesive structure 1 is for being adhered to and clamped between the front cover 91 and the display panel 92. In the embodiments of the present invention, the electronic device 90 is a touch control cellular phone; however, the present invention is not limited to this.

Figure 4:
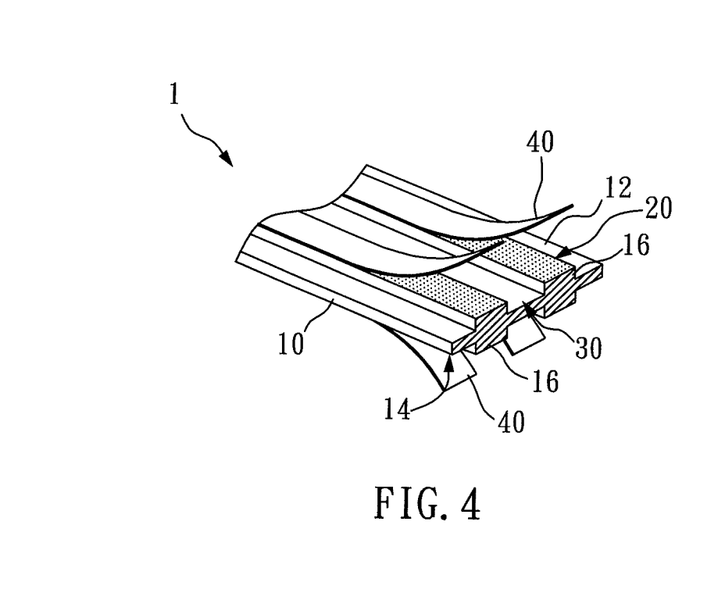
FIG. 4 is an illustration of the appearance of the waterproofing backing adhesive structure according to the first embodiment of the present invention.
Figure 5:
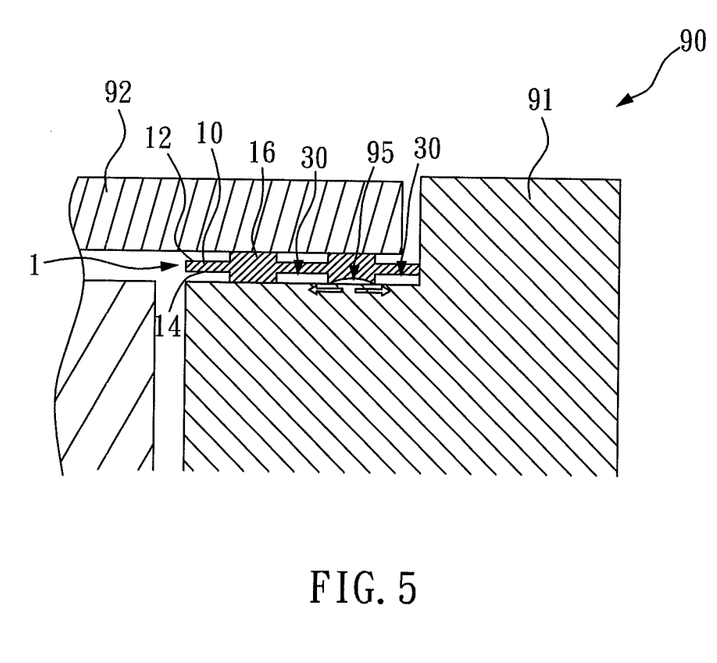
FIG. 5 is a lateral cutaway view drawing of the waterproofing backing adhesive structure attached between the front cover and the display panel according to the first embodiment of the present invention.

Please refer to FIG. 4 and FIG. 5, which are illustrations of the structure of the waterproofing backing adhesive structure according to the first embodiment of the present invention. FIG. 4 is an illustration of the appearance of the waterproofing backing adhesive structure according to the first embodiment of the present invention; FIG. 5 is a lateral cutaway view drawing of the waterproofing backing adhesive structure attached between the front cover and the display panel according to the first embodiment of the present invention.

As shown in FIG. 4, in the first embodiment of the present invention, the waterproofing backing adhesive structure 1 of the present invention includes a backing adhesive main body 10, an adhesive material 20, a plurality of air chambers 30, and at least one paper-film 40. The backing adhesive main body 10 includes an upper surface 12, a bottom surface 14, and a plurality of ribs 16, wherein the plurality of ribs 16 are formed in a unitary piece and protrude slightly from the upper surface 12 and the bottom surface 14 of the backing adhesive main body 10. Due to the spacing of the plurality of ribs 16 or interweaving among each of the ribs 16, a plurality of air chambers 30 can be formed. In the first embodiment of the present invention, there are a total of four ribs 16; the ribs 16 are formed in pairs on the upper surface 12 and on the bottom surface 14 of the backing adhesive main body 10. Moreover, each of the ribs 16 is parallel to each other and is arranged such that it extends parallel to the length of the backing adhesive main body 10. The heights of the ribs 16 on the same surface are essentially the same, but the heights of each of the ribs 16 on different surfaces can be different; and the positions of the ribs on different surfaces can correspond to each other, or they can be otherwise arranged.

The adhesive material 20, which is attached to the backing adhesive main body 10, is used for adhering the backing adhesive main body 10 between the front cover 91 and the display panel 92. As shown in FIG. 4, in the first embodiment of the present invention, the adhesive material 20 is attached to the ribs 16; however, the present invention is not limited to this; it can be attached to the upper surface 12 or to the bottom surface 14 of the backing adhesive main body 10 between any ribs 16.

As shown in FIG. 4, the paper-film 40 can be adhered to the backing adhesive main body 10. When the waterproofing backing adhesive structure 1 of the present invention is used, the plurality of paper-films 40 are to be removed from the backing adhesive main body 10. In the first embodiment of the present invention, the quantity of the paper-films 40 is one on the top and another on the bottom; however, the quantity of the paper-films 40 is not limited to this.

As shown in FIG. 5, in the first embodiment of the present invention, after the paper-film 40 is removed, the waterproofing backing adhesive structure of the present invention is to be adhered between the front cover 91 and the display panel 92 of the electronic device 90 with the adhesive material 20 on the ribs 16. After the adhesion, if an bubble 95 is formed between a partial section of one rib 16 of the two ribs 16 and the front cover 91 or the display panel 92, then due to the gradual expansion of the bubble 95, a gap appears in the same section of the ribs 16 and between the ribs 16 and the front cover 91 or the display panel 92. In this way, the air of the bubble 95 is able to be transferred to the nearby air chamber 30 (as shown with an arrow in FIG. 5) and will not form a large gap due to its having a complete horizontal opening between the waterproofing backing adhesive structure 1 and the front cover 91 or the display panel 92 such that water vapor can easily enter via the large gap, and cause the failure of the backing adhesive eventually, as stated in the prior art. In addition, because air in the bubble 95 enters the air chamber 30, the bubble 95 is prevented from continuously expanding to another rib 16 due to the airtight pressure, so as to maintain close adhesion between another rib 16 and the front cover 91 or the display panel 92 on the backing adhesive main body 10. Because of the close adhesion between another rib 16 and the front cover 91 or the display panel 92, the waterproofing backing adhesive structure 1 can continuously maintain the waterproofing function.

However, it can be noticed from the above description that once an bubble 95 develops on the same corresponding location (the odds of having another bubble at the same spot are very low) of the another rib 16 and expands as well and causes the failure of the rib 16, the problem of losing the waterproofing function of the waterproofing backing adhesive structure 1 can arise, as mentioned in the prior art. Therefore, the quantity of the ribs 16 installed in the backing adhesive main body 10 of the present invention, within a certain range of the width, is not limited to two, as shown in FIG. 4., more ribs 16 can be installed to reduce the odds of the aforementioned problem as long as the sufficient adhesion is remained.

Figure 6:
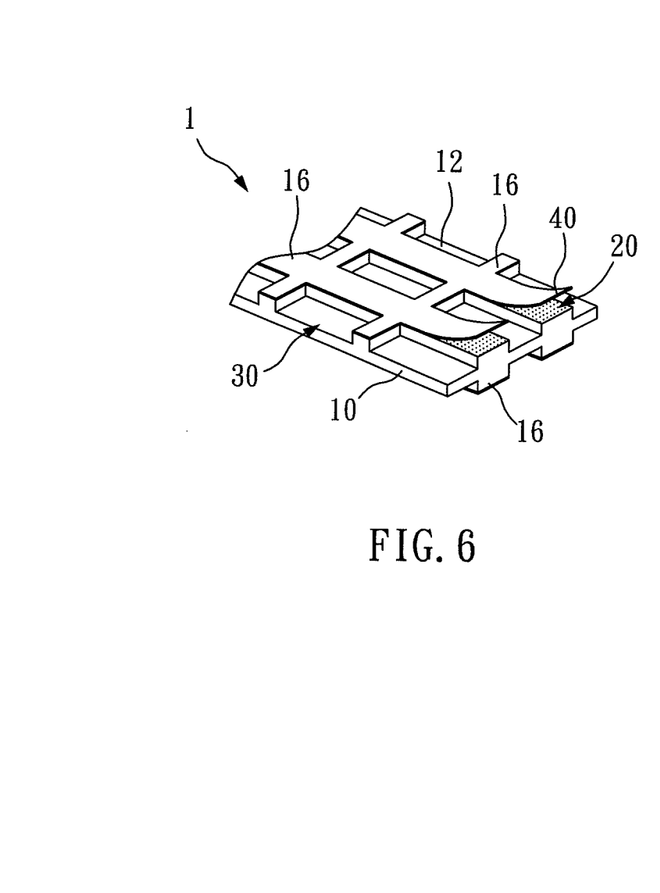
FIG. 6 is an illustration of the appearance of the waterproofing backing adhesive structure according to the second embodiment of the present invention.
Figure 7:
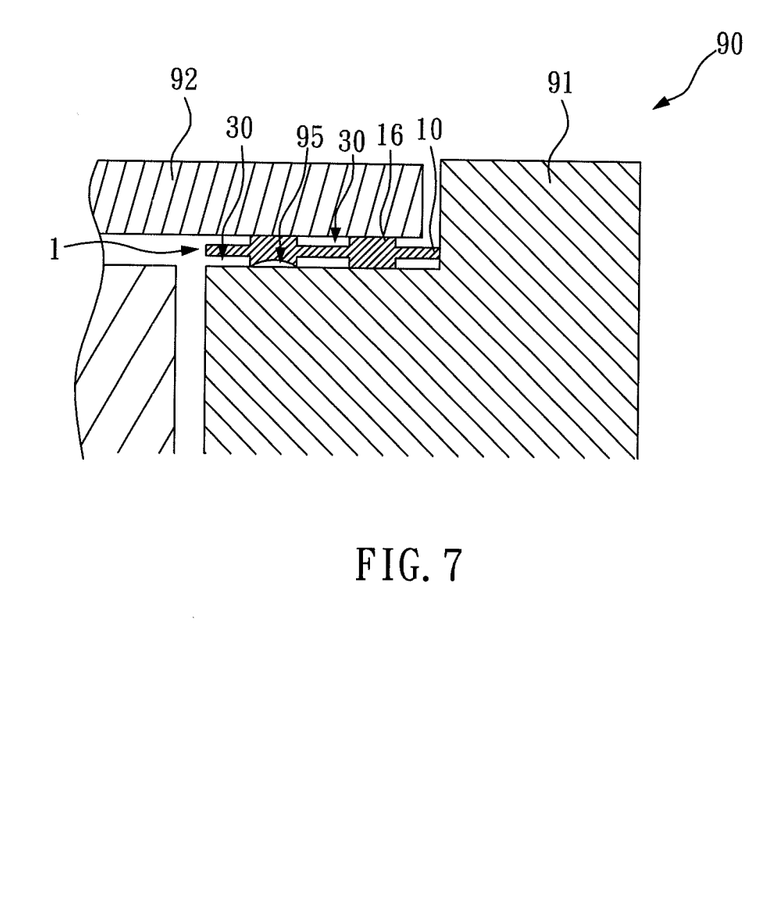
FIG. 7 is a lateral cutaway perspective drawing of the waterproofing backing adhesive structure attached between the front cover and the display panel according to the second embodiment of the present invention.

Next, please refer to FIG. 6 and FIG. 7. FIG. 6 is an illustration of the appearance of the waterproofing backing adhesive structure according to the second embodiment of the present invention; FIG. 7 is a lateral cutaway perspective drawing of the waterproofing backing adhesive structure attached between the front cover and the display panel according to the second embodiment of the present invention.

As shown in FIG. 6, the second embodiment of the present invention differs from the first embodiment of the present invention in that the plurality of ribs 16 are installed in an interwoven fashion, and each of the air chambers 30 is formed in a square by the interwoven arrangement of the ribs 16. As shown in FIG. 7, similarly, in the second embodiment of the present invention, if an bubble 95 forms between a partial section of one of the ribs 16 and the front cover 91 or the display panel 92 and causes separation of the surface of the partial section of the rib 16 and the front cover 91 or the display panel 92 due to expansion, the air in the bubble 95 can leak into a nearby air chamber 30 to achieve a result similar to that aforementioned in the first embodiment. Because the waterproofing backing adhesive structure 1 in the second embodiment of the present invention has more ribs 16 with the adhesive material 20, it can provide stronger adhesion than that in the first embodiment.

Figure 8:
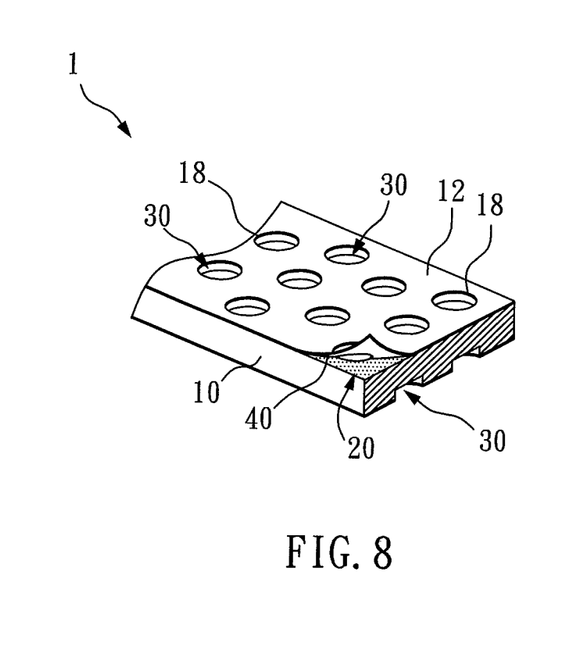
FIG. 8 is an illustration of the appearance of the waterproofing backing adhesive structure according to the third embodiment of the present invention.
Figure 9:
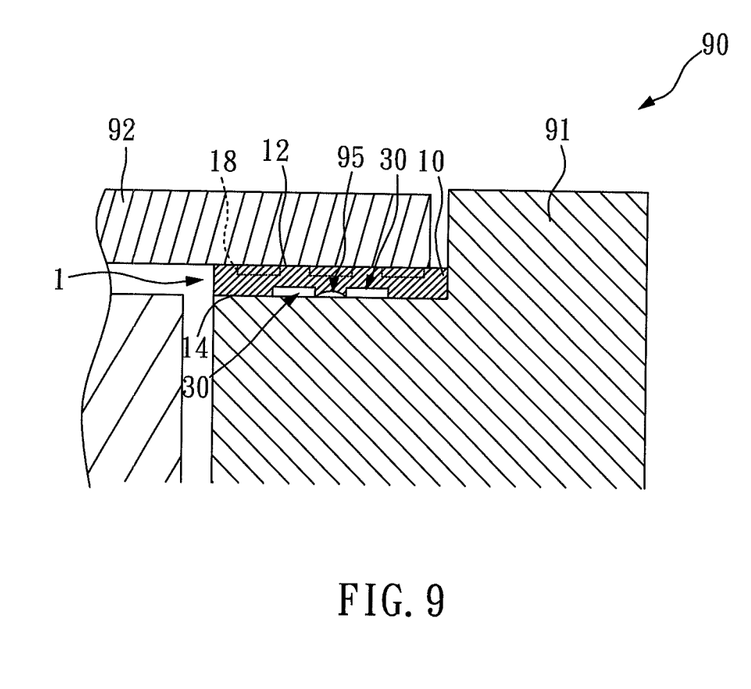
FIG. 9 is a lateral cutaway perspective drawing of the waterproofing backing adhesive structure attached between the front cover and the display panel according to the third embodiment of the present invention.

Finally, please refer to FIG. 8 and FIG. 9. FIG. 8 is an illustration of the appearance of the waterproofing backing adhesive structure according to the third embodiment of the present invention. FIG. 9 is a lateral cutaway perspective drawing of the waterproofing backing adhesive structure attached between the front cover and the display panel according to the third embodiment of the present invention.

As shown in FIG. 8, the third embodiment of the present invention differs from the first embodiment and the second embodiment of the present invention in that in the backing adhesive main body 10, protruding ribs 16 are no longer used to form the plurality of air chambers 30; instead, the plurality of air chambers 30 are formed with inward concave sockets 18. In this third embodiment of the present invention, the plurality of sockets 18 are round in shape, and the method of arrangement is similar to that of a matrix board, with both horizontal and vertical distribution of straight lines, but it can also be arranged with staggered spacing. However, the shape and the distribution of the plurality of sockets 18 of the waterproofing backing adhesive structure 1 of the present invention are not limited to this. As shown in FIG. 8 and FIG. 9, in the third embodiment of the present invention, the waterproofing backing adhesive structure 1 is adhered between the front cover 91 and the display panel 92 with the adhesive material 20 of the upper surface 12 and the bottom surface 14 of the backing adhesive main body 10; if a bubble 95 develops between the backing adhesive main body 10 and the front cover 91 or the display panel 92 and expands to cause separation of one part of the backing adhesive main body 10 from the front cover 91 or the display panel 92, the air in the bubble 95 will be exhausted to a nearby air chamber 30, as aforementioned in each of the previous embodiments, to achieve a result similar to that mentioned above.

It is to be noted that the above embodiments are only for illustration of the preferred embodiments of the present invention. In order to avoid redundancies, not all possible combinations are recorded in detail. However, those skilled in the art should understand that any implementations of the above-mentioned principles can be modified as needed; any designs that can form air chambers 30 in the backing adhesive main body 10 can fall within the scope of the present invention. It is to be understood that the formations of air chambers 30 with ribs 16 and with sockets 18 are actually the same in concept. In other words, from the viewpoint of the upper surface of the ribs 16, the spaces between each of the ribs 16 can be considered as the sockets 18; on the other hand, from the viewpoint of the upper surface of the inner sockets 18, the structures surrounding the upper surface of the inner sockets 18 can be considered as each of the ribs 16. Thus, the two formations of the air chambers 30 in the embodiments share the same relative concept. Additionally, it is preferable to have each of the air chambers 30 independent and without connections, but it does not exclude the possibility of having local or nearby air chambers 30 connected.

It is noted that the above-mentioned embodiments are only for illustration. It is intended that the present invention cover modifications and variations of the present invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A waterproofing backing adhesive structure to be applied to an electronic device having a front cover and a display panel, the waterproofing backing adhesive structure being used for being adhered between the front cover and the display panel and comprising:
    a backing adhesion main body, comprising an upper surface and a bottom surface;
    an adhesive material, which is to be adhered to at least one of the surfaces of the upper surface and the bottom surface of the backing adhesive main body to adhere the backing adhesive main body between the front cover and the display panel; and
    a plurality of air chambers, formed on at least one surface of the upper surface or the bottom surface of the backing adhesive main body where there is the adhesive material and used for accommodating the air of a bubble generated when the backing adhesive main body is attached to the front cover or the display panel; the plurality of air chambers are for releasing the pressure of the bubble,
    wherein the at least one of the surface of the backing adhesion main body where there is the adhesive material is a smooth surface, such that the at least one of the surface is flatly adhered on the front cover or the display panel, and
    wherein there is no adhesive material on the at least one surface where the plurality of air chambers are formed.

2. The waterproofing backing adhesive structure as claimed in claim 1, wherein at least one of the surfaces of the upper surface and the bottom surface of the backing adhesive main body comprises a plurality of ribs which form the air chambers between them.

3. The waterproofing backing adhesive structure as claimed in claim 2, wherein the heights of the plurality of ribs on the same surface of the hacking adhesive main body are essentially the same.

4. The waterproofing backing adhesive structure as claimed in claim 1, wherein at least one of the surfaces of the upper surface and the bottom surface comprises the plurality of sockets through which the plurality of air chambers are formed.

5. The waterproofing backing adhesive structure as claimed in claim 1, wherein the waterproofing backing adhesive structure comprises at least one paper-film, and the at least one paper-film is adhered to the adhesive material of the surface of the backing adhesive main body.

6. The waterproofing backing adhesive structure as claimed in claim 2, wherein the plurality of ribs on the same surface of the backing adhesive main body are installed in a parallel fashion, and extend in the direction of the length of the backing adhesive main body.

7. The waterproofing backing adhesive structure as claimed in claim 6, wherein the upper surface and the bottom surface of the backing adhesive main body both comprise the plurality of ribs which are installed in a parallel fashion.

8. The waterproofing backing adhesive structure as claimed in claim 7, wherein the plurality of the parallel ribs on the upper surface and the bottom surface of the backing adhesive main body correspond to each other.

9. The waterproofing backing adhesive structure as claimed in claim 2, wherein the plurality of the ribs on the same surface of the backing adhesive main body are installed in an interwoven fashion.

10. The waterproofing backing adhesive structure as claimed in claim 9, wherein the upper surface and the bottom surface of the backing adhesive main body both comprise the plurality of ribs which are installed in an interwoven fashion.

11. The waterproofing backing adhesive structure as claimed in claim 10, wherein the plurality of the interwoven ribs on the upper surface and the bottom surface of the backing adhesive main body correspond to each other.

12. The waterproofing backing adhesive structure as claimed in claim 1, wherein each of the air chambers is independent and is not connected to any other.

13. An electronic device, comprising:
a front cover;
a display panel; and
a waterproofing backing adhesive structure, which is adhered between the front cover and the display panel, and the waterproofing backing adhesive structure comprises:
  a backing adhesion main body, comprising an upper surface and a bottom surface;
  an adhesive material which is to be adhered to at least one of the surfaces of the upper surface and the bottom surface of the backing adhesive main body in order to adhere the backing adhesive main body between the front cover and the display panel; and
  a plurality of air chambers which are formed on at least one of the surfaces of the upper surface or the bottom surface of the backing adhesive main body where there is the adhesive material for accommodating the air of a bubble generated when the backing adhesive main body is attached to the front cover or the display panel; the plurality of air chambers are for releasing the pressure of the bubble,
wherein the at least one of the surface of the backing adhesion main body where there is the adhesive material is a smooth surface, such that the at least one of the surface is flatly adhered on the front cover or the display panel, and
wherein there is no adhesive material on the at least one surface where the plurality of air chambers are formed.

14. The electronic device as claimed in claim 13, wherein at least one of the surfaces of the upper surface and the bottom surface of the backing adhesive main body comprises a plurality of ribs which form the air chambers between them.

15. The electronic device as claimed in claim 14, wherein the heights of the plurality of ribs on the same surface of the backing adhesive main body are essentially the same.

16. The electronic device as claimed in claim 13, wherein at least one of the surfaces of the upper surface and the bottom surface of the backing adhesive main body comprises the plurality of sockets, through which a plurality of air chambers is formed.

17. The electronic device as claimed in claim 13, wherein the waterproofing backing adhesive structure comprises at least one paper-film, and the at least one paper-film is adhered to the adhesive material of the surface of the backing adhesive main body.

18. The electronic device as claimed in claim 14, wherein the plurality of ribs on the same surface of the backing adhesive main body are installed in a parallel fashion and extend in the direction of the length of the backing adhesive main body.

19. The electronic device as claimed in claim 18, wherein the upper surface and the bottom surface of the backing adhesive main body both comprise the plurality of ribs which are installed in a parallel fashion.

20. The electronic device as claimed in claim 19, wherein the plurality of parallel ribs on the upper surface and the bottom surface of the backing adhesive main body correspond to each other.

21. The electronic device as claimed in claim 14, wherein the plurality of the ribs on the same surface of the backing adhesive main body are installed in an interwoven fashion.

22. The electronic device as claimed in claim 21, wherein the upper surface and the bottom surface of the backing adhesive main body both comprise the plurality of ribs which are installed in an interwoven fashion.

23. The electronic device as claimed in claim 22, wherein the plurality of the interwoven ribs on the upper surface and the bottom surface of the backing adhesive main body correspond to each other.

24. The electronic device as claimed in claim 13, wherein each of the air chambers is independent and is not connected to any other.

* * * * *